Figure 1:
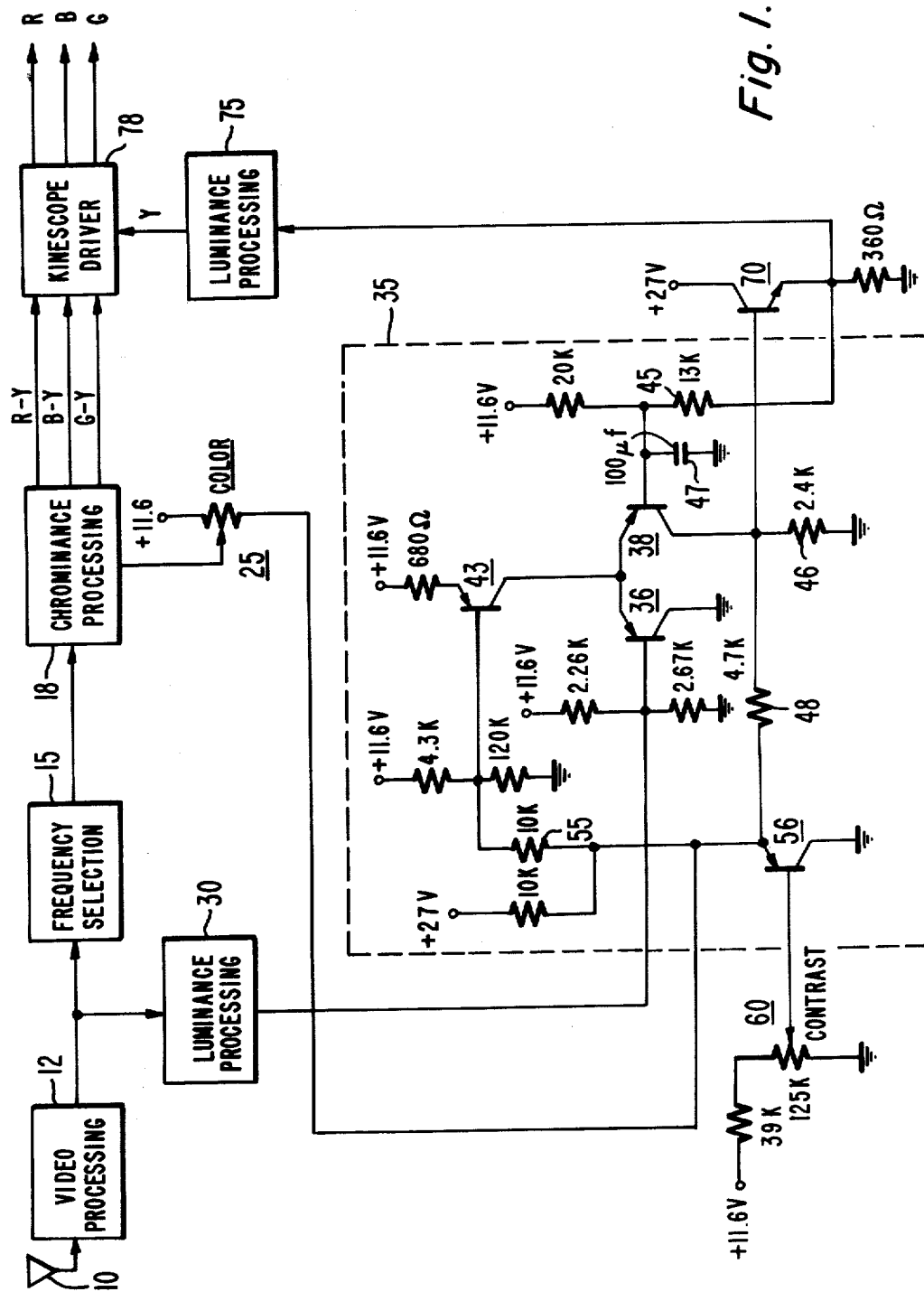

United States Patent [19]
Parker

[11] 4,198,652
[45] Apr. 15, 1980

[54] D.C. GAIN CONTROLLED AMPLIFIER
[75] Inventor: Robert P. Parker, Indianapolis, Ind.
[73] Assignee: RCA Corporation, New York, N.Y.
[21] Appl. No.: 904,779
[22] Filed: May 11, 1978
[51] Int. Cl.² .............................................. H04N 9/535
[52] U.S. Cl. .................................... 358/27; 330/285; 329/50
[58] Field of Search ..................... 358/27, 39, 40, 184; 330/29; 329/50

[56] References Cited
U.S. PATENT DOCUMENTS

| 3,651,418 | 3/1972 | Wittmann | 329/50 |
| 3,764,931 | 10/1973 | Waku et al. | 330/29 |

OTHER PUBLICATIONS
"CA3144G TV Luminance Processor", RCA Corp. Solid State Division, Somerville, N.J., 6-76.

Primary Examiner—Richard Murray
Attorney, Agent, or Firm—Eugene M. Whitacre; William H. Meagher; Ronald H. Kurdyla

[57] ABSTRACT

A D.C. gain controlled differential amplifier exhibiting balanced operation and a linear gain control response. The amplifier includes input and output emitter coupled transistors and a current source transistor. Input signals are supplied to the base of the input transistor, and a negative feedback network is D.C. coupled from the collector to base of the output transistor. A D.C. gain control voltage varies the conduction of the current source transistor to thereby vary the gain of the emitter coupled transistors. The control voltage is also D.C. coupled to a collector signal output of the output transistor to maintain the output quiescent level substantially constant as the amplifier is gain controlled.

13 Claims, 2 Drawing Figures

D.C. GAIN CONTROLLED AMPLIFIER

This invention relates to a balanced, D.C. gain controlled amplifier with a linear gain control response.

Many signal processing systems require a gain controllable amplifier which exhibits a substantially linear relationship between amplifier gain and a D.C. gain control voltage. A differential amplifier can be utilized for this purpose by controlling the quiescent operating current of the differential amplifier, since the small signal gain of a differential amplifier is linearly proportional to the quiescent current level. In particular, this control can be accomplished by D.C. controlling the level of quiescent current supplied by a current source associated with the amplifier.

An amplifier of this type preferably should exhibit balanced operation. However, the balance and linear operation of such an amplifier can be upset by variations in the parameters and operating characteristics of transistors comprising the amplifier. Illustratively, these variations can be attributed to variations in transistor forward current gain (Beta) and the base-emitter junction voltage ($V_{BE}$) from device to device due to process or temperature variations. Either of those factors can yield unacceptably non-linear gain control operation.

The adverse effects of these variations can be essentially nullified when the gain controlled differential amplifier is formed as an integrated circuit, since the transistor devices forming the amplifier can be easily matched with respect to current gain and base-emitter junction voltage characteristics, such that the variations are similar and exhibit a tracking relationship. However, this result can be difficult to obtain when the amplifier comprises discrete devices, since the parameters and operating characteristics of the individual devices are more difficult to match and are more susceptible of dissimilar variations on a unit-to-unit basis.

In the case of a direct current coupled gain controlled amplifier, it is also often desirable for the quiescent direct current component of the gain controlled output signal to remain substantially invariant as gain control is effected. This result facilitates direct current coupling of the amplifier to succeeding circuits without requiring complicated interstage biasing networks to assure that the bias of succeeding stages is not upset as the amplifier is gain controlled.

Gain controlled amplifiers are often employed in a television signal processing system such as a color television receiver. A color television receiver includes luminance and chrominance channels for respectively processing image representative luminance and chrominance components of a composite color television signal. As is known, these components are ultimately combined (e.g., in a kinescope dirver state or in the kinescope itself) for producing color image representative signals.

The relative amplitudes of the luminance and chrominance components which are combined determine the level of saturation of the color image displayed by the kinescope. Thus for a given amplitude of the chrominance component, adjustment of the gain of the luminance channel to adjust the amplitude of the luminance component serves to alter the saturation of the reproduced image. Color television receivers commonly include means for accomplishing the latter adjustment (e.g., a contrast control) to satisfy viewer preferences by allowing the viewer to compensate for ambient light conditions and variations in the transmitted television signal.

In recognition of the fact that the relative amplitude of the luminance and chrominance components affect image saturation, some color television receiver signal processing circuits are arranged so that a luminance gain control circuit (i.e., a contrast control potentiometer) and a chrominance gain control circuit (i.e., a color control potentiometer) are interconnected such that adjustment of the luminance control to vary the amplitude of the luminance component causes a corresponding variation in the amplitude of the chrominance component. That is, the amplitudes of the luminance and chrominance components "track" with each other as the luminance contrast control is adjusted, thereby permitting the image contrast to be adjusted without adversely affecting the level of image saturation. An arrangement of this type is described in U.S. Pat. No. 3,961,361 of Jack Avins, et al.

In a television receiver employing an interconnected luminance and chrominance gain control mechanism of this type, gain controllable transistor amplifiers in the luminance and chrominance channels are advantageous for varying the amplitude of the luminance and chrominance components in response to a suitably provided, adjustable D.C. control voltage. The amplifiers preferably should exhibit a linear gain control characteristic, and should be arranged so that factors such as variations in transistor current gain or base-emitter junction voltage do not impair the desired gain control characteristic. As pointed out above, such variations can be particularly prevalent and troublesome in the case of a gain controlled amplifier formed of discrete circuit components. It is also desirable for the gain controlled amplifier to be arranged so that the quiescent component of the gain controlled output signal remains substantially constant, for the reasons noted above.

In accordance with the present invention, a balanced, linearly gain controlled amplifier comprises first and second amplifier transistors with input, output and interconnected common electrodes, a source of operating currents for te transistors, and a load impedance coupled to the output electrode of one of the transistors. The level of the operating currents and thereby the signal gain of the amplifier transistors are varied in accordance with the level of a gain control voltage. A network responsive to the gain control voltage supplies an auxiliary current to the load impedance, the auxiliary current being subject to variations of a sense opposite to the sense of operating current variations which are caused by the gain control voltage. A feedback network is direct current coupled between the output and input electrodes of the one transistor, for rendering the input electrode of that transistor responsive to the quiescent voltage across the load impedance.

In accordance with one aspect of the invention, the first and second amplifier transistors comprise discrete devices.

In accordance with another aspect of the invention, the amplifier is included in a system for processing a color television signal having luminance and chrominance signal components. Specifically, the amplifier is included in a luminance channel for amplifying the luminance component, and a chrominance channel includes a chrominance signal amplifier having a balanced, linear gain control response similar to the luminance amplifier. A voltage used to control the gain of the luminance amplifier also serves to control the gain of the chrominance amplifier such that a desired relationship between the amplitudes of the luminance and chrominance signals is preserved.

Figure 2:
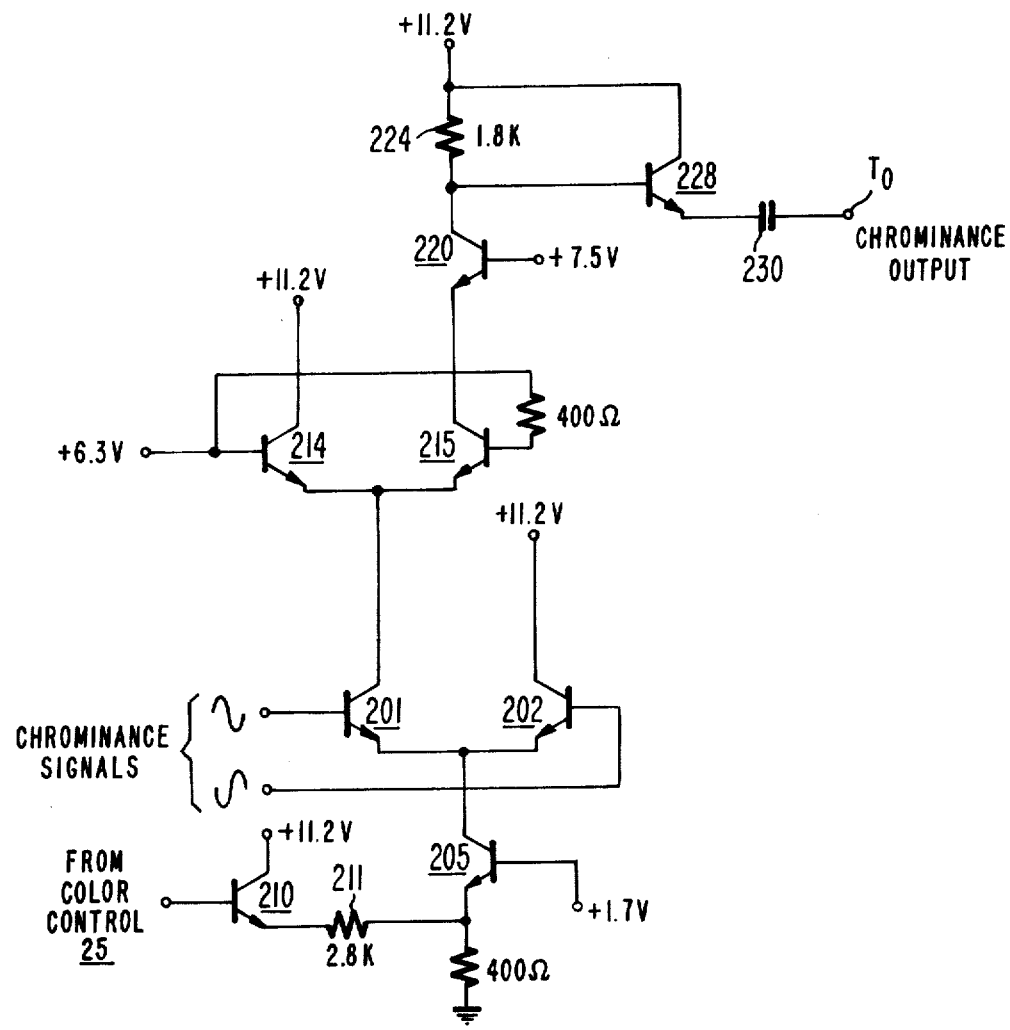

In the drawing:

FIG. 1 shows, partially in block form and partially in schematic circuit diagram form, a general arrangement of portions of a color television receiver including a gain controlled luminance signal amplifier circuit constructed in accordance with the present invention; and FIG. 2 shows a gain controlled chrominance signal amplifier circuit included in the receiver.

In FIG. 1, a video signal processing stage 12 responds to radio frequency color television signals received by an antenna 10 for generating, by means of suitable intermediate frequency amplification and detection circuits (not shown), a composite video signal comprising luminance and chrominance components.

The chrominance component is selectively coupled via a frequency selection stage 15 to a chrominance signal processing stage 18 included in a chrominance channel of the receiver for developing R-Y, B-Y and G-Y color difference signals. A color control comprising a potentiometer 25 and an associated source of positive direct voltage (+11.6 volts) is also coupled to chrominance stage 18. A wiper of potentiometer 25 is connected to a gain control input of a variable gain chrominance signal amplifier, included in stage 18, for varying the gain of the chrominance amplifier and thereby the level of chrominance signals processed by stage 18 in accordance with the setting of potentiometer 25. The variable gain chrominance amplifier is shown in FIG. 2 and will be discussed subsequently.

The luminance component of the video output signal from video processor 12 is amplified and otherwise translated by a luminance signal processing stage 30. Output signals from luminance stage 30 are applied to an input of a variable gain luminance amplifier circuit 35, output signals from which are coupled to an input of a further luminance processing stage 75 via the emitter of an emitter follower transistor 70. A contrast control comprising a potentiometer 60 resistively coupled to a source of direct voltage (+11.6 volts) serves to control the gain of amplifier circuit 35 and thereby the amplitude of luminance signals supplied to luminance processor 75, as will be discussed. Luminance processor 30, amplifier circuit 35, and luminance processor 75 comprise a luminance processing channel of the receiver together with additional circuits (not shown).

Luminance signals from processor 75 are combined with the color difference signals from chrominance processor 18 in a kinescope driver stage 78 for producing R, B and G color output signals. These signals are then suitably coupled to intensity control electrodes of a color kinescope (not shown) for reproducing a color image in response to the color signals.

In this example, gain controlled amplifier 35 is formed of discrete circuit elements and comprises emitter coupled PNP transistors 36 and 38 arranged in differential amplifier configuration, and a PNP current source transistor 43 for supplying operating currents for transistors 36 and 38.

Luminance signals from stage 30 are direct current coupled to a base input of transistor 36, and a variable gain control voltage is coupled to a base electrode of current source transistor 43 via the wiper of contrast control potentiometer 60, an emitter of a grounded collector transistor 56, and a resistor 55. The luminance signals applied to the base of transistor 36 are of sufficiently small amplitude so that amplifier transistors 36, 38 operate within a linear conduction region throughout the gain control range. Gain control of amplifier 35 is accomplished by adjusting potentiometer 60, which in turn varies the emitter potential of transistor 56 and thereby the base potential of transistor 43. The base potential of transistor 43 is increased and decreased in accordance with the setting of potentiometer 60, which causes the level of conduction of transistor 43, and therefore the current supplied to transistors 36 and 38, to increase and decrease a corresponding amount. The signal gain of transistors 36 and 38 increases and decreases accordingly. In this connection, it is noted that transistor 43 provides a substantially constant level of quiescent current for a given setting of potentiometer 60. Employing the D.C. gain control voltage to vary the conduction of current source transistor 43 in this manner causes the signal gain of amplifiers 36, 38 to vary linearly with the gain control voltage. Gain controlled luminance signals appear across a collector load resistor 46 at a collector output of transistor 38 and are direct current coupled to luminance processor 75 by means of follower transistor 70.

The D.C. gain control potential developed at the emitter of transistor 56 is also direct current copuled to color control potentiometer 25 which normally serves to control the gain of the chrominance amplifier included in chrominance processor 18 in accordance with the setting of the wiper of potentiometer 25. The gain of the chrominance amplifier is also adjusted in accordance with the setting of contrast potentiometer 60 since, for a given setting of potentiometer 25, the control voltage provided from the wiper of contrast potentiometer 60 produces a porportional voltage at the wiper of color potentiometer 25. Thus the signal gain adjustment of the chrominance amplifier tracks with the signal gain adjustment of luminance amplifier 35 in accordance with the setting of contrast control 60.

The chrominance amplifier is shown in FIG. 2 and comprises a pair of emitter coupled transistor 201, 202 arranged in differential amplifier configuration, and a current source transistor 205 which supplies operating currents for transistors 201, 202. Chrominance signals are supplied to input base electrodes of transistors 201, 202 in push-pull relation. The wiper of color control potentiometer 25 (FIG. 1) is D.C. coupled to a base electrode of an emitter follower transistor 210, an emitter of which is connected to an emitter of current source transistor 205 via a resistor 211.

Gain control of amplifier 201, 202 is accomplished by adjusting the base potential of transistor 210 (e.g., by varying the setting of color control 25), which in turn varies the emitter potential of transistor 210 and thereby the emitter current of transistor 205. The emitter current of transistor 205 increases and decreases in accordance with the base potential of transistor 210, which causes the level of conduction of transistor 205, and therefore the current supplied to transistors 201 and 202, to increase and decrease a corresponding amount. The signal gain of transistors 201, 202 increases and decreases accordingly such that the signal gain of amplifier 201, 202 varies linearly with the gain control potential.

Gain controlled chrominance signals appear at a collector output electrode of transistor 201 and are coupled via transistor 215 of an upper rank transistor pair 214, 215 and a transistor 220 to an output load resistor 224. The chrominance signals are then A.C. coupled from the collector of transistor 220 to an output terminal $T_O$ by means of a transistor 228 and a capacitor 230. Signals from terminal $T_O$ are afterwards further processed by additional circuits within chrominance processor 18.

In this example, all of the circuit elements shown in FIG. 2, except coupling capacitor 230, are fabricated as an integrated circuit (e.g., the CA3151 signal processing integrated circuit marketed by the Solid State Division of RCA Corporation, Somerville, New Jersey). The transistor devices and transistors 201, 202 in particular share a common thermal environment and exhibit closely matched operating parameters and characteristics, which serves to insure balanced operation of differential amplifier 201, 202 (e.g., with respect to current gain and $V_{BE}$ variations).

Referring back to FIG. 1, it is noted that amplifier 35 includes a negative bias stabilization feedback network comprising the base-emitter junction of follower transistor 70 (which provides a substantially constant D.C. offset voltage over the gain control range) and a resistor 45 direct current coupled in series from the collector output of transistor 38 to a base of transistor 38. This feedback network serves to sense an imbalance in amplifier operation which may occur due to $V_{BE}$ voltage variations or current gain (Beta) variations associated with transistors 36 and 38, and compensates for such imbalance. For example, if the foward current conduction or $V_{BE}$ characteristics of discrete transistors 36 and 38 are nominally mismatched due to process or temperature variations, the quiescent collector current of transistor 38 can deviate from a normally expected level such that the quiescent collector current of transistor 38 exceeds that of transistor 36. The collector voltage of transistor 38 is then caused to deviate above an expected level by a proportional amount. This voltage is fed back to the base of transistor 38 in a sense to reduce the current conduction of transistor 38 and thereby correct for the deviation (i.e., the current imbalance). A capacitor coupled to the base of transistor 38 serves by bypass A.C. signals to ground.

It is also noted that the D.C. gain control voltage which appears at the emitter of transistor 56 is D.C. coupled to the collector output of amplifier transistor 38 by means of a resistor 48. This connection serves to stabilize the output voltage against variations of the output quiescent level which are produced as the setting of contrast potentiometer 60 and thereby the amplifier gain is varied. By means of this connection, current is either added to or subtracted from the collector current of transistor 38 so that the quiescent output voltage of transistor 38 is substantially constant independent of the D.C. gain control voltage.

An example will serve to clarify the relationship between and respective roles of feedback network 45, 70 and the connection comprising resistor 48. An increasingly positive gain control voltage causes the collector current of transistor 43 to decrease, which in turn reduces the amount of current supplied to emitter coupled transistors 36, 38 and transistor 38 in particular.

In the absence of the connection including resistor 48, the quiescent output level of transistor 38 would tend to become less positive. This tendency would be opposed by the action of feedback network 45, 70, which would cause the conduction of transistor 38 to increase a corresponding amount in response to the (less positive) voltage feedback from the collector to the base of transistor 38. However, this result would be inconsistent with the desired result of a gain controlled signal, since the feedback network would maintain a substantially constant level of current for transistor 38 as the gain control voltage is varied. That is, only the current conduction of transistor 36 would vary in accordance with the gain control voltage.

The connection including resistor 48 prevents this result by supplying a compensating amount of direct current to load impedance 46 at the collector of transistor 46, so that the shift in the quiescent output level of transistor 38 does not occur in response to the more positive gain control voltage. An analogous result is obtained when potentiometer 60 is adjusted to provide a less positive gain control voltage. Since the quiescent output level of transistor 38 is stabilized by virtue of the connection including resistor 48, the feedback network does not oppose variations in the level of current conduction of transistor 38 and thereby variations in the gain of transistor 38 caused by adjustment of the gain control voltage. However, for a particular gain control voltage, feedback network 45, 70 will sense and compensate for a deviation of the quiescent output level of transistor 38 from an expected level (e.g., due to temperature induced current gain or $V_{BE}$ variations), as mentioned previously.

Since the output collector voltage of transistor 38 is stabilized with respect to output quiescent current changes by means of the connection from the source of gain control voltage to the collector of transistor 38, and since the feedback network including transistor 70 and resistor 45 is utilized to balance differential amplifier 36, 38 for the given output voltage, then the differential amplifier exhibits balanced operation over the range of gain control. Gain controlled amplifier 35 thus exhibits a linear signal gain response with respect to the D.C. gain control voltage, a substantially invariant quiescent output level as gain control is effected, and balanced operation despite variations in the base-emitter voltage ($V_{BE}$) and forward current gain (Beta) of the differential amplifier transistors. The described amplifier 35 therefore presents an attractive alternative when a variable gain amplifier comprising discrete devices is desired, although the described amplifier except bypass capacitor 47 can also be fabricated as an integrated circuit.

Since amplifier 35 exhibits the desirable characteristics mentioned above, it can be advantageously employed in conjunction with an integrated variable gain chrominance amplifier of the type shown in FIG. 2, which also exhibits a linear gain control response and balanced operation. Thus adjustment of contrast control 60 to linearly vary the amplitude of luminance signals processed by amplifier circuit 35 causes the amplitude of chrominance signals processed by chrominance amplifier 201, 202 (FIG. 2) to linearly vary a corresponding amount. The tracking relationship which results assures that the relative amplitudes of the luminance and chrominance signals remain in desired relationship as the image contrast is adjusted. The level of color image saturation consequently remains unimpaired.

Although the invention has been described with reference to a particular embodiment, various additional modifications can be made within the scope of the invention.

For example, the network including resistor 45 and follower transistor 70 can be replaced by a resistor of appropriate value (e.g., ten kilohms) direct coupled between the collector and base of transistor 38. In this instance, output signals developed at the collector of transistor 38 would be directly applied to the input of luminance processor 75. However, the use of follower transistor 70 as shown reduces the loading on the collector circuit of transistor 38, thereby permitting slightly greater signal gain to be achieved.

Also, it may be desirable in a particular system for the gain controlled output signals to exhibit an opposite polarity (i.e., inverted) relative to the input signals. With reference to amplifier 35 of FIG. 1, this result can be accomplished by providing a load impedance in the collector circuit of transistor 36 for developing gain controlled output signals thereacross. This circuit would exhibit linear, balanced operation in the same fashion as amplifier 35 of FIG. 1, except that the quiescent output level of transistor 36 would vary with changes in the gain control voltage. These variations can be prevented from influencing the bias of succeeding circuits by coupling the gain controlled output signals from the collector of transistor 36 to these circuits via a D.C. blocking capacitor.

Mutually inverted input and gain controlled output signals can also be provided by arranging signal input transistor 36 in the manner shown for transistor 38. Thus the collector circuit of transistor 36 would include a load impedance for developing gain controlled signals thereacross, degenerative feedback from the collector to base, and a connection from the source of gain control voltage to the collector of transistor 36, all in accordance with the principles discussed for amplifier 35 of FIG. 1. In this case, means should be provided in the feedback network for bypassing A.C. signals (e.g., to ground). Also in this instance, the connections to transistor 38 including resistor 48 and the feedback network 45, 70 need not be provided, in which event the collector of transistor 38 would be grounded and the base of transistor 38 would be appropriately biased.

What is claimed is:

1. A balanced, linearly gain controlled amplifier comprising:
    first and second amplifier transistor with input, output and interconnected common electrodes;
    means for supplying operating currents to said first and second transistors;
    a load impedance coupled to the output electrode of one of said transistors;
    means for providing a first gain control voltage;
    means for coupling said first gain control voltage to said current supply means for varying the level of said operating currents in accordance with the level of said control voltage, to thereby vary the signal gain of said amplifier transistors;
    means responsive to said first gain control voltage for supplying an auxiliary current to said load impedance subject to variations of a sense opposite to the sense of operating current variations caused by said control voltage; and
    feedback means direct current coupled between the output and input electrodes of said one transistor, for rendering said input electrode of said one transistor responsive to the quiescent voltage across said load impedance.

2. An amplifier according to claim 1, wherein:
    the magnitude of said auxiliary current variations is substantially equal to the magnitude of the variations in operating current supplied to said one transistor caused by said gain control voltage variations.

3. An amplifier according to claim 1, wherein: 'said first and second amplifier transistors comprise discrete devices.

4. An amplifier according to claim 1, wherein:
    input signals to be amplified are coupled to one of said input electrodes; and
    output signals are developed across said load impedance.

5. An amplifier according to claim 1, wherein:
    said one transistor corresponds to said second transistor; and
    input signals to be amplified are coupled to said input electrode of said first transistor.

6. An emplifier according to claim 1, wherein:
    said input, output and common electrodes correspond to base, collector and emitter electrodes, respectively, and said first and second transistors are arranged in differential amplifier configuration; and
    said means for supplying operating currents comprises a current source transistor having a main current conduction path coupled in common to said emitter electrodes.

7. A balanced, linearly gain controlled amplifier comprising:
    first and second differentially connected amplifier transistors with base input, collector output and interconnected common emitter electrodes;
    means comprising a current source transistor having a main current conduction path coupled in common to said emitter electrodes, for supplying operating currents to said first and second transistors;
    a load impedance coupled to the collector output electrode of one of said transistors;
    means for providing a first gain control voltage;
    means for coupling said first gain control voltage to said current source transistor for varying the level of said operating currents in accordance with the level of said control voltage, to thereby vary the signal gain of said amplifier transistors;
    means responsive to said first gain control voltage for supplying an auxiliary current to said load impedance subject to variations of a sense opposite to the sense of operating current variations caused by said control voltage;
    feedback means direct current coupled between the collector and base electrodes of said one transistor, for rendering said base electrode of said one transistor responsive to the quiescent voltage across said load impedance; and wherein
    said one transistor corresponds to said second transistor;
    output signals are coupled to the base of said first transistor; and
    said feedback means includes a resistance direct current coupled between said collector and base electrodes of said second transistor.

8. An amplifier according to claim 7, and further comprising a transistor for coupling output signals from said collector of said second transistor to utilization means, and wherein
    said feedback means includes a base-emitter junction of said coupling transistor and said resistance arranged in series relation between said collector and base electrodes of said second transistor.

9. An amplifier according to claim 8, wherein:
    said coupling transistor is arranged in emitter follower configuration.

10. A balanced, linearly gain controlled amplifier in a system for processing a color television signal having image representative luminance and chrominance components, wherein said amplifier comprises:
   first and second amplifier transistors with input, output and interconnected common electrodes;
   means for supplying operating currents to said first and second transistors;
   a load impedance coupled to the output electrode of one of said transistors;
   means for providing a first gain control voltage;
   means for coupling said first gain control voltage to said current supply means for varying the level of said operating currents in accordance with the level of said control voltage, to thereby vary the signal gain of said amplifier transistors;
   means responsive to said first gain control voltage for supplying an auxiliary current to said load impedance subject to variations of a sense opposite to the sense of operating current variations caused by said control voltage; and
   feedback means direct current coupled between the output and input electrodes of said one transistor, for rendering said input electrode of said one transistor responsive to the quiescent voltage across said load impedance; and wherein said system includes
   a luminance channel for processing said luminance component, said gain controlled amplifier being included in said luminance channel for amplifying said luminance component;
   a chrominance channel for processing said chrominance component, said chrominance channel including a chrominance amplifier having a gain control input and a balanced, linear gain control response similar to said luminance amplifier; and
   means for coupling said first gain control voltage to said gain control input of said chrominance amplifier such that the amplitudes of said luminance and chrominance components can be varied in the same sense in response to the magnitude of said first control voltage, to thereby preserve a desired relationship between the amplitudes of said luminance and chrominance components.

11. An arrangement according to claim 10, wherein: said first and second transistors forming said gain controlled luminance amplifier comprise discrete devices.

12. An arrangement according to claim 10, and further comprising:
   a source of second gain control voltage coupled to said gain control input of said chrominance amplifier for controlling the gain thereof.

13. An arrangement according to claim 12, wherein: said first gain control voltage is coupled to said gain control input of said chrominance amplifier via said source of second gain control voltage.

* * * * *